United States Patent [19]

Hirata

[11] Patent Number: 5,847,611

[45] Date of Patent: Dec. 8, 1998

[54] FRACTIONAL DIVIDED FREQUENCY SYNTHESIZER WITH PHASE ERROR COMPENSATING CIRCUIT

[75] Inventor: Kenro Hirata, Tokyo, Japan

[73] Assignee: Mitsubishi Denki Kabushiki Kaisha, Tokyo, Japan

[21] Appl. No.: 948,022

[22] Filed: Oct. 10, 1997

Related U.S. Application Data

[63] Continuation of Ser. No. 681,966, Jul. 30, 1996, abandoned.

[30] Foreign Application Priority Data

Aug. 8, 1995 [JP] Japan ............................. 7-202269

[51] Int. Cl.$^6$ ................................................. H03L 7/197
[52] U.S. Cl. ........................ 331/1 A; 331/10; 331/17; 331/25
[58] Field of Search ........................ 331/1 A, 10, 11, 331/17, 25

[56] References Cited

U.S. PATENT DOCUMENTS

| | | | |
|---|---|---|---|
| 5,093,632 | 3/1992 | Hietala et al. | 331/1 A |
| 5,180,993 | 1/1993 | Dent | 331/16 |
| 5,414,391 | 5/1995 | Hori | 331/16 |

FOREIGN PATENT DOCUMENTS

| | | |
|---|---|---|
| 0557799 | 9/1993 | European Pat. Off. . |
| 5-503827 | 6/1993 | Japan . |
| 6-338792 | 12/1994 | Japan . |
| 2 026 268 | 1/1980 | United Kingdom . |
| 2 228 840 | 9/1990 | United Kingdom . |
| 95/12243 | 5/1995 | WIPO . |

OTHER PUBLICATIONS

Adachi, Hisashi et al., High–Speed Frequency–Switching Synthesizer Using Fractional N Phase–Locked Loop, Electronics and Communications in Japan, Part 2, vol. 77, No. 4, (New York, Apr. 1994), pp. 20–28.

*Primary Examiner*—Siegfried H. Grimm
*Attorney, Agent, or Firm*—Burns, Doane, Swecker & Mathis, LLP

[57] ABSTRACT

In a frequency synthesizer, a variable frequency divider divides the oscillation signal of a VCO while switching the frequency dividing ratio in accordance with an integral frequency dividing ratio generated by a frequency dividing ratio generating circuit. The VCO is controlled with an output of a loop filter. The frequency dividing ratio generating circuit includes multiple integrators connected in cascade and differentiators which differentiate the carry-out signals of the integrators, so that a phase error generated at the variable frequency divider is obtained from an output of an adder included in the final stage integrator of the frequency dividing ratio generating circuit. A phase error compensation value is output, and further a pulse width of a signal to be used for compensating for phase error is varied in accordance with the phase error compensation value to perform compensation for the phase error.

9 Claims, 16 Drawing Sheets

FRACTIONAL DIVIDED FREQUENCY SYNTHESIZER WITH PHASE ERROR COMPENSATING CIRCUIT

This application is a continuation of application Ser. No. 08/681,966, filed Jul. 30, 1996 and now abandoned.

BACKGROUND OF THE INVENTION

1. Field of the Invention

The present invention relates to a frequency synthesizer to be used in a local oscillator of radio communications equipment.

2. Description of the Prior Art

In radio communications equipment for mobile telephones or the like, transmission and reception require switching between many frequency channels quickly. To achieve this, a frequency synthesizer is indispensable to change the frequency of a local oscillator of radio communications equipment at a high-speed.

Heretofore various methods have been proposed to speed up the switching of frequencies in frequency synthesizers. Japanese Patent Laid-Open Publication No. Hei 5-503827 discloses a method in which data for phase error compensation is produced from a difference between an addition result of an integrator in a final stage among integrators included in a frequency dividing ratio generating means and an addition result of an integrator of the previous stage thereof, and this data is converted in a D/A converter to perform phase error compensation.

Furthermore, FIG. 11 shows a frequency synthesizer of fractional divider type described by Adachi, Kosugi, Ueno, and Nakabe in "High-Speed Frequency Switching Synthesizer Using Fractional N Phase-Locked Loop" in Electronics and Communications in Japan, Part 2, Vol. 77, No. 4, New York, April 1994, pp. 20–28. In the frequency synthesizer shown in FIG. 11, the reference frequency signal of a crystal oscillator 1 is divided in a fixed frequency divider 2, and is then input to a phase comparator 3. Furthermore, in FIG. 11, the numerals respectively designate: 4, a charge pump for converting and outputting an output of phase comparator 3 into a current or voltage; 5, a loop filter for filtering the signal output of charge pump 4; and 6, a voltage-controlled oscillator (VCO) in which an oscillation frequency is controlled by an output of loop filter 5. An output of voltage-controlled oscillator 6 is fed back to phase comparator 3 through a variable frequency divider 7. A frequency dividing ratio generating means 8 is shown in detail in FIG. 12, and comprises an adder 10, and an integrator 100 consisting of an adder 11 and a latch 15. Adder 11 has a carry-out signal CO which is output when the addition result is $2^M$ or higher. This output and a preset frequency dividing ratio value N of variable frequency divider 7 are added at adder 10, and the addition result is input to variable frequency divider 7. A clock for latch 15 is supplied from fixed frequency divider 2.

The operation of frequency dividing ratio generating means 8 of the above-mentioned prior art is described hereinafter. N is the integral part of the frequency dividing ratio to be set and λ is the decimal part so that the frequency dividing ratio to be set can be expressed as N+λ. In the above-mentioned conventional example, an increment step of the decimal part λ is $½^M$ and $$\lambda = m/2^M$$

for an arbitrary preset value m, where m is an integer in the range $0 \leq m \leq 2^M$. Adder 11 adds m to the output of latch 15, and, when the addition result reaches $2^M$ and causes an overflow, outputs carry-out signal CO. When an integer m is fed to an input of integrator 100 comprising adder 11 and latch 15, an overflow occurs at a rate of once every $2^M/m$ clocks, and the carry-out signal CO is output. This is set to 1 and added to frequency dividing ratio N at adder 10 to produce a frequency dividing ratio for variable frequency divider 7. As a result, the frequency dividing ratio is N for $2^M/m - 1$ times out of $2^M/m$ clocks, and N+1 for the remaining 1 time. Therefore, the average frequency dividing ratio becomes $N+m/2^M$ and the desired frequency dividing ratio can be obtained by appropriately setting m.

FIG. 13 is a waveform diagram showing an operation when M=2 and m=1. In this case, a preset value m=1 and the output of latch 15 are fed to the input terminals of adder 11, which is a 2-bit adder. The addition result of adder 11 increments by 1 each time a clock is supplied, as shown in FIG. 13 (b), and when this value reaches 4, adder 11 outputs a carry-out signal CO, as shown in (c) of the same figure, and the addition result of adder 11 becomes 0. The addition of the carry-out signal CO and the frequency dividing ratio N at adder 10 is output as shown in (d) of the same figure.

The phase error in the case of the above-mentioned composition becomes a stepped configuration as shown in FIG. 13 (e). This occurs since the frequency dividing ratio, which should by design always be N+¼, is appropriately changed to N and N+1, and has a period of $2^M$ times the clock period, the amplitude of which takes on a value of the integration value of the frequency dividing ratio error multiplied by 2π(rad). The phase error is converted into a voltage or current at phase comparator 3 and charge pump 4, then enters VCO 6 through loop filter 5, and an output of VCO 6 is modulated so that spurious emissions are generated at an interval of $½^M$ times the reference frequency $f_{ref}$.

FIG. 14 shows a z transform of frequency dividing ratio generating means 8 shown in FIG. 12. In this conventional example, integrator 100 results in multiplying $½^M$ by integer m and performing integration, so that a value λ which is input by an adder 34 in the z transform of frequency dividing ratio generating means 8 is $\lambda = m/2^M$. Adder 11 of frequency dividing ratio generating means 8 shown in FIG. 12 outputs the carry-out signal each time an overflow occurs, and the output of adder 11 takes on a value for the present integration value from which $2^M$ is subtracted, so that frequency dividing ratio generating means 8 in the z transform, as shown in FIG. 14, comprises a 1-clock delay circuit 35 in the z transform, an adder 36 in the z transform, and a quantizer 37 in the z transform. Therefore, the decimal part λ' which is output from frequency dividing ratio generating means 8 of FIG. 14 is expressed in formula (1) below.

$$\lambda' = \lambda + Q_1(1 - Z^{-1}) \quad (1)$$

Here, $Q_1(1-Z^{-1})$ corresponds to an error of the frequency dividing ratio, and phase error $Q_1$ becomes the time integral. As can be seen from FIG. 14, phase error $Q_1$ becomes the output of adder 11 with inverted polarity and divided by $2^M$.

In a fractional divider method having the above-mentioned composition, it is necessary to narrow the loop band to suppress the spurious emissions. As a result, it is difficult to speed up the switching of frequencies in frequency synthesizers.

The above-mentioned prior art also describes a frequency synthesizer of fractional divider type which solves these types of difficulties found in the conventional example. FIG. 15 shows frequency dividing ratio generating means 8 having the same composition as the one described in the prior art. Although frequency dividing ratio generating means 8 in this case is similar to those in the above-mentioned conventional example in having integrator 100 consisting of adder 10, adder 11, and latch 15, it further includes an integrator 101 consisting of an adder 12 and a latch 16, and a differentiator 102 consisting of an adder 13 and a latch 17, where an output of differentiator 102 is input to adder 10. The output of adder 11 is fed into adder 12 and integration is performed, and its carry-out signal CO is time differentiated at differentiator 102, then added with the carry-out signal CO of adder 11 at adder 10. The clock for latches 15, 16, and 17 is supplied from fixed frequency divider 2.

A result of the z transform on above-mentioned frequency dividing ratio generating means 8 is shown in FIG. 16 and comprises adder 34 in the z transform, 1-clock delay circuit 35 in the z transform, adder 36 in the z transform, and quantizer 37 in the z transform. Although this is similar to FIG. 14, adders 38, 39, 41, and 43 in the z transform, 1-clock delay circuits 40 and 44 in the z transform, and quantizer 42 in the z transform are further included. From this figure, an output $X_1$ of quantizer 37 and an output $X_2$ of adder 43 are respectively $$X_1 = \lambda - Z^{-1}Q_1 = Q_1 = \lambda + (1-Z^{-1})Q_1 \quad (2)$$

$$X_2 = (1-Z^{-1})(-Q_1 - Z^{-1}Q_2 + Q_2) \quad (3)$$
$$= (1-Z^{-1})Q_1 + (1-Z^{-1})^2 Q_2$$

$$X_1 + X_2 = \lambda' = \lambda + (1-Z^{-1})^2 Q_2 \quad (4)$$

As can be seen from the formulas above, by composing frequency dividing ratio generating means 8 as shown in FIG. 16, the error of the frequency dividing ratio becomes $Q_2(1-Z^{-1})^2$ so that the phase error becomes its integration value $Q_2(1-Z^{-1})$. Compared to the above-mentioned conventional example, since $Q_1$ is canceled and a time differentiation is performed on $Q_2$, the frequency characteristics of the phase error are shifted toward the high band. Thus, since the PLL having low-frequency bandpass characteristics allows spurious emissions to be easily removed, the loop band can be set wider than in the above-mentioned conventional example, enabling high-speed frequency switching.

Output waveforms showing an operation in each compositional element of frequency dividing ratio generating means 8 are shown in FIG. 17 where the carry-out signal CO of adder 12 is FIG. 17 (e), the output of adder 13 is (f) of the same figure, the output of adder 10 is (g) of the same figure, and the phase error is (h) in the same figure. The frequency characteristics are shifted toward the high band so that low-frequency spurious emissions can be suppressed.

Although a case in the above-mentioned conventional example was described where integrators were connected in cascade in 2 stages, if integrators are connected to n stages, as shown in FIG. 18, with the carry-out signal CO of an integrator 106 of the nth stage differentiated to the (n−1)th order, and the sum of the differential values for all stages is taken, the z transform of decimal part $\lambda'$ of the frequency dividing ratio becomes $$\lambda' = \lambda + (1-Z^{-1})^n Q_n \quad (5)$$

and a phase error $\theta_E$ becomes $$\theta_E = 2\pi(1-Z^{-1})^{n-1} Q_n \quad (6)$$

Therefore, spurious emissions at the low band can be further suppressed.

However, to sufficiently reduce the spurious emissions using the prior art mentioned above, it is necessary to set the reference frequency $f_{ref}$ which is the output signal of the frequency divider, to an extremely high value; in order to do this, it is necessary to have a phase comparator which is capable of phase comparison operations at a high frequency. Therefore, use of a phase comparator employed in conventional PLL-ICs and fabricated from a process such as CMOS having slow operations presented a difficulty, and low power consumption and low cost were difficult to achieve.

SUMMARY OF THE INVENTION

It is therefore an object of this invention to solve the above-mentioned problems and to provide a low power consumption, low cost, frequency synthesizer of fractional divider type which is capable of sufficiently reducing spurious emissions at a phase comparison frequency lower than that of frequency synthesizers of fractional divider type in conventional examples.

The frequency synthesizer in accordance with this invention includes a crystal oscillator, a fixed frequency divider which divides the output of the crystal oscillator to output a reference frequency, a voltage-controlled oscillator, a variable frequency divider which divides the output of the voltage-controlled oscillator at a frequency dividing ratio provided by a frequency dividing ratio generating means, a phase comparator which detects and outputs a phase difference of the reference frequency and an output of the variable frequency divider, a loop filter which smoothes the phase difference signal output from the phase comparator to output a signal which controls the above-mentioned voltage-controlled oscillator, and the frequency dividing ratio generating means which provides and controls an integer frequency dividing ratio to the above-mentioned variable frequency divider.

A phase synchronization loop is composed to control the voltage-controlled oscillator with the output of the above-mentioned loop filter, and the above-mentioned frequency dividing ratio generating means, comprising n stages (n=1, 2,3, . . . ) of integrators connected in cascade and n−1 differentiators for differentiating carry-out signals of the integrators, are composed so that a phase error generated at the above-mentioned variable frequency divider is obtained from an output of the adder included in the integrator in a final stage of the frequency dividing ratio generating means and a phase error compensation value is output.

The frequency synthesizer further includes a phase error compensating means for varying the pulse width of a signal to be used for compensating for phase error based on the phase error compensation value which is output from the above-mentioned frequency dividing ratio generating means.

Furthermore, the frequency dividing ratio generating means comprises integrators, differentiators, and one adder, where the integrators are connected in cascade to n stages and the carry-out signal of the integrator in the ith stage is differentiated to the (i−1)th order.

The outputs of the differentiators are all input to the adder where a sum is taken with the integral part of the frequency dividing ratio, and the result is input as the frequency dividing ratio of the variable frequency divider.

Furthermore, by differentiating to the (n−1)th order the integration result of the integrator of the nth stage, the phase error compensation value is extracted and input to the phase error compensating means.

In the phase error compensating means, the pulse width of the signal to be used for compensating for phase error is varied to compensate for the phase error by switching between operation or non-operation of a current supply or voltage supply in accordance with a value counted by the fixed frequency divider.

Furthermore, the phase error compensating means comprises an adder for adding a phase error compensation value extracted from the frequency dividing ratio generation circuit with a preset value and for outputting the result; a subtracter for subtracting the phase error compensation value extracted from the frequency dividing ratio generation circuit from a preset value and for outputting the result; and a plurality of comparators for performing comparisons on outputs of the adder and subtracter and the value counted by the fixed frequency divider so that the pulse width of a signal to be used for compensating for phase error is varied to compensate for the phase error by passing outputs of the comparators through gates and flip-flops and outputting a control signal for switching between operation and non-operation of the current supply or voltage supply.

The outputs of the phase comparator and phase error compensating means are handled as current outputs, and the phase comparator and phase error compensating means are directly connected. The loop filter includes a frequency trap which adapts to a predetermined frequency.

An output of a reference frequency divider is delayed by one period of the signal output by the crystal oscillator. Furthermore, a comparator for comparing the value counted by the reference frequency divider with a predetermined value, and a flip-flop for inputting the output of the comparator while using the crystal oscillator output as a clock are included, where the output of the flip-flop is used as a clock for the integrators and differentiators of the frequency dividing ratio generating means.

The frequency dividing ratio generating means in this invention is capable of varying in time the frequency dividing ratio to be provided to the variable frequency divider, and providing a specific decimal frequency dividing ratio as an average frequency dividing ratio to the variable frequency divider. The variable frequency divider divides the oscillation signal from the voltage-controlled oscillator (VCO) in accordance with the frequency dividing ratio generated by frequency dividing ratio generating means and outputs the result to the phase comparator. The phase comparator compares the reference frequency output by the fixed frequency divider with the phase of the signal output by the variable frequency divider and controls the charge pump in accordance with the phase difference. The charge pump performs charging and discharging of the loop filter in accordance with the output of the phase comparator, and performs control of the VCO. The phase error compensating means control the pulse width of the signal to be used for compensating for phase error based on the phase error compensation value which is output from the frequency dividing ratio generating means, and compensates for the phase error caused by changes in the frequency dividing ratio of the variable frequency divider.

The frequency dividing ratio generating means comprise n (1,2,3, . . . ) integrators, n−1 differentiators, and multiple adders, so that the frequency characteristics of the phase error are shifted toward the high band. Since the PLL having low-frequency bandpass characteristics easily enables spurious emissions to be removed, the loop band can be set even wider to enable high-speed frequency switching. It is not necessary to set reference frequency $f_{ref}$, the output signal of the frequency divider, particularly high, and spurious emissions can be sufficiently reduced at a phase comparison frequency even lower than that in the conventional example, resulting in a low power consumption and low cost frequency divider of fractional diver type.

DETAILED DESCRIPTION OF THE PREFERRED EMBODIMENTS

First Embodiment

Figure 1:
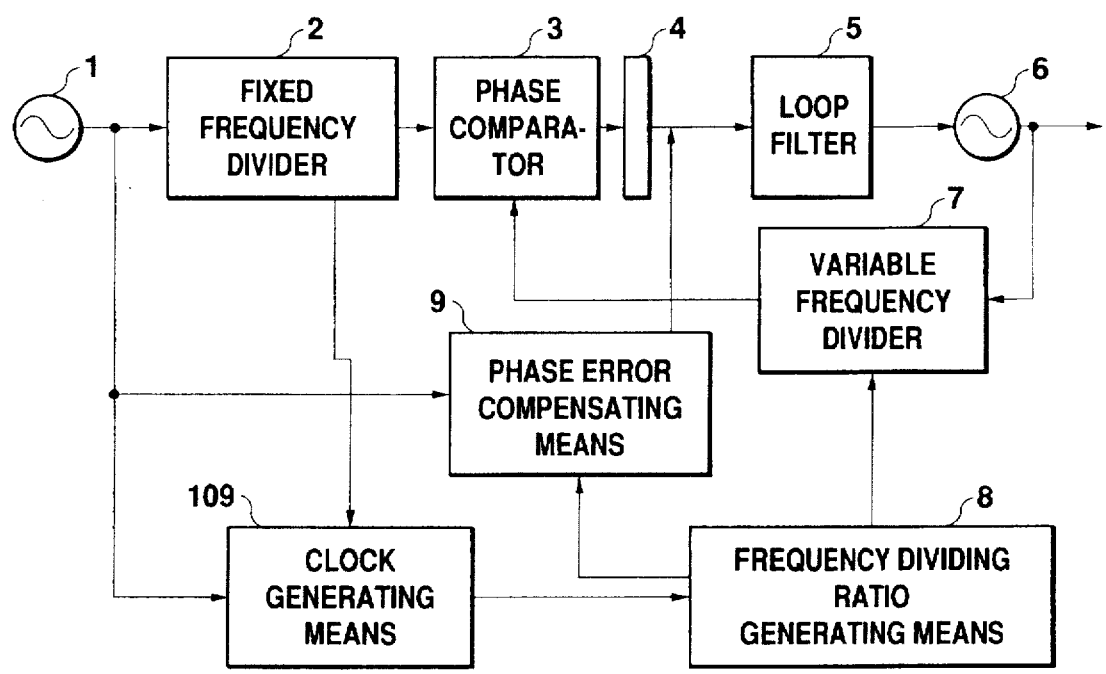
FIG. 1 is a block diagram showing an embodiment of a frequency synthesizer according to this invention.
Figure 11:
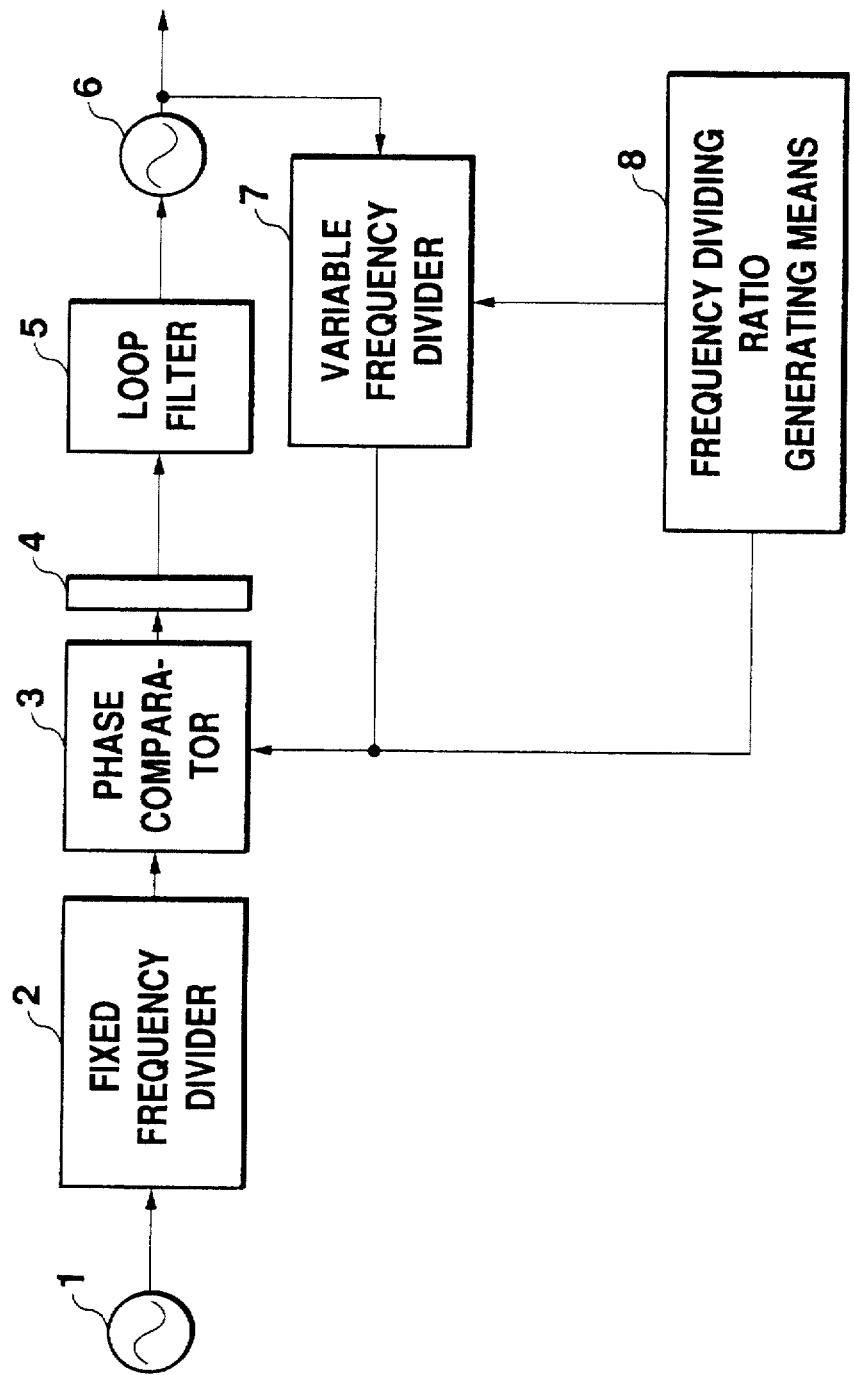
FIG. 11 is a block diagram showing a conventional synthesizer.

The following describes a first embodiment of this invention. FIG. 1 is a block diagram showing a first embodiment of this invention wherein the numerals designate respectively: 1, a crystal oscillator; 2, a fixed frequency divider for dividing the output of crystal oscillator 1 and providing a reference frequency $f_{ref}$ to a phase comparator 3; 4, a charge pump; 5, a loop filter; 6, a voltage-controlled oscillator; 7, a variable frequency divider for performing frequency division on the output of voltage-controlled oscillator 6 in accordance with a frequency dividing ratio. This composition is the same as that of the conventional example shown in FIG. 11. Further, in FIG. 1, numeral 8 designates a frequency dividing ratio generating means. Numeral 9 designates a phase error compensating means and, in this embodiment, the output of phase error compensating means 9 is joined with the output of charge pump 4. Numeral 109 designates a clock generating means for providing a clock to the frequency dividing ratio generating means.

Figure 2:
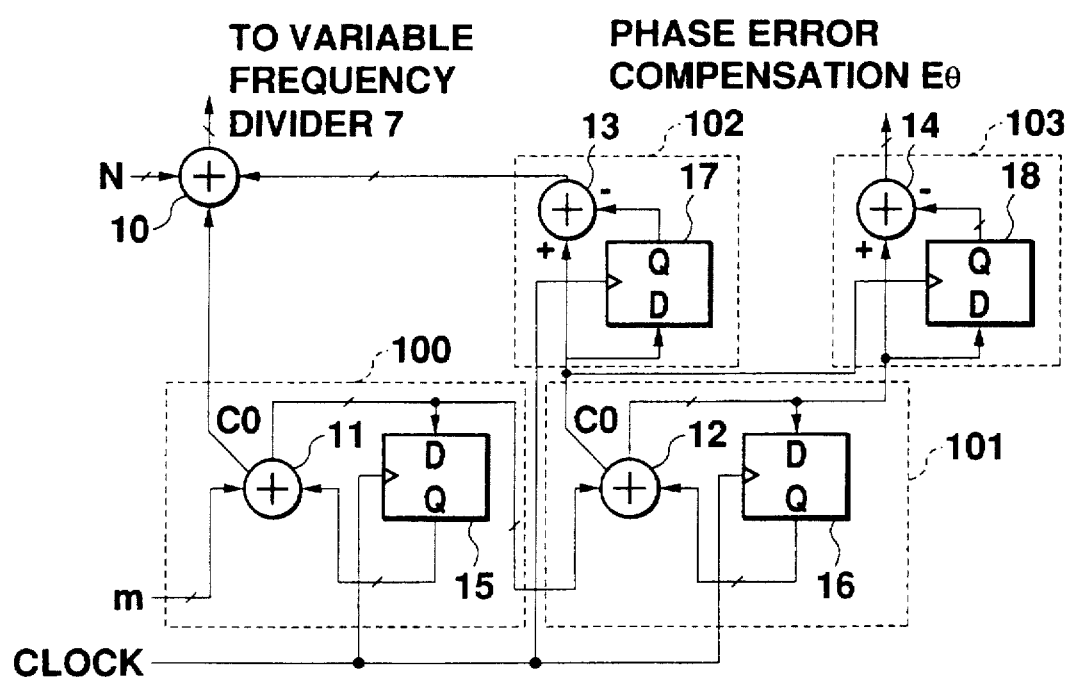
FIG. 2 is a circuit diagram showing a frequency dividing ratio generating means to be used in the embodiment shown in FIG. 1.
Figure 12:
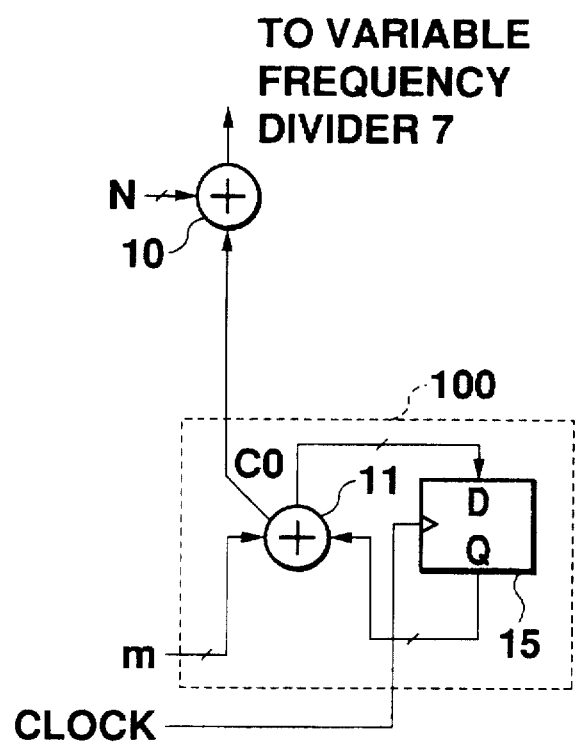
FIG. 12 is a circuit diagram showing one example of a conventional frequency dividing ratio generating means.
Figure 13:
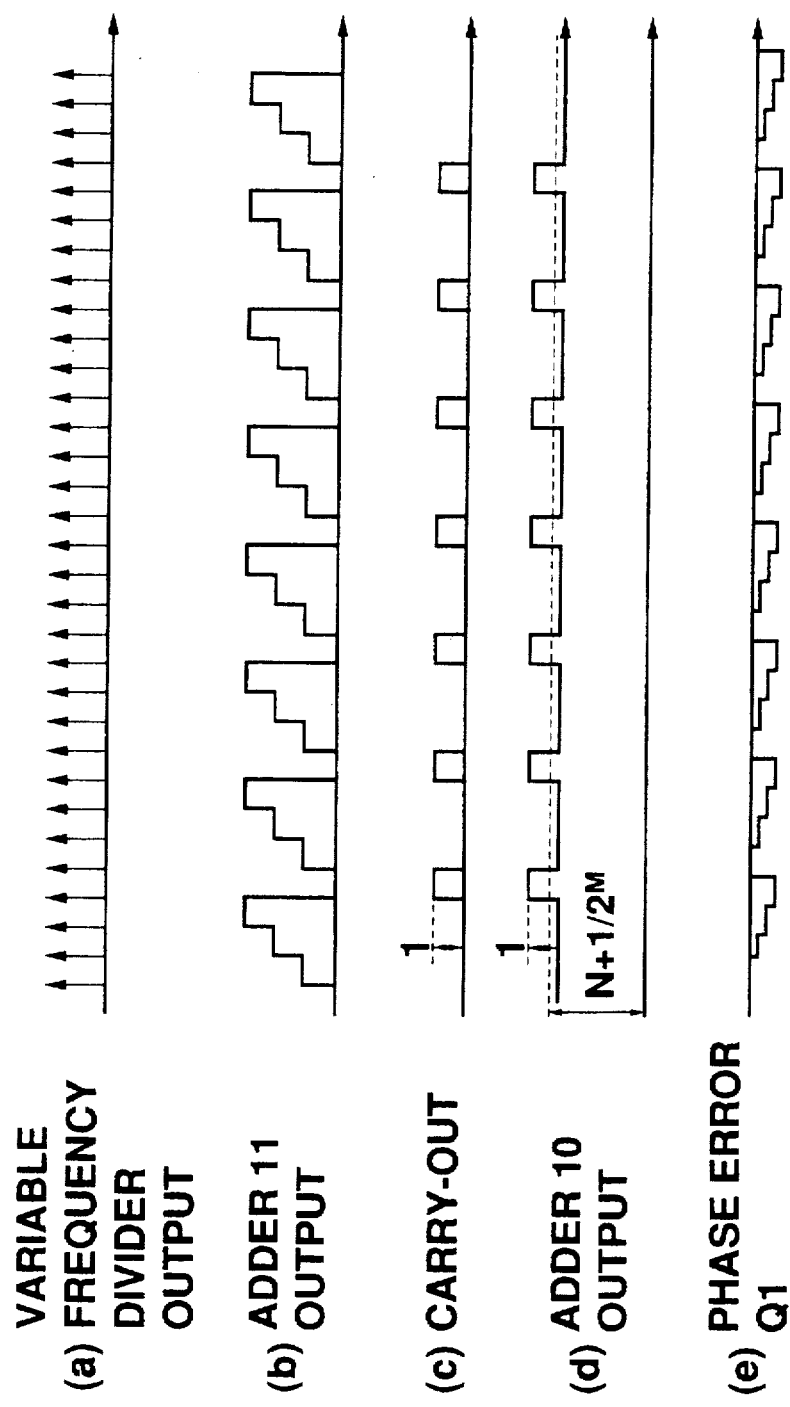
FIG. 13 is a waveform diagram showing an operation of a conventional frequency dividing ratio generating means.
Figure 14:
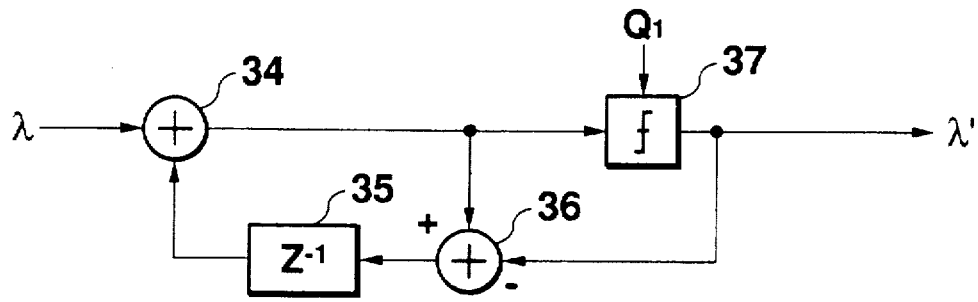
FIG. 14 shows a z transform of the frequency dividing ratio generating means shown in FIG. 12.
Figure 15:
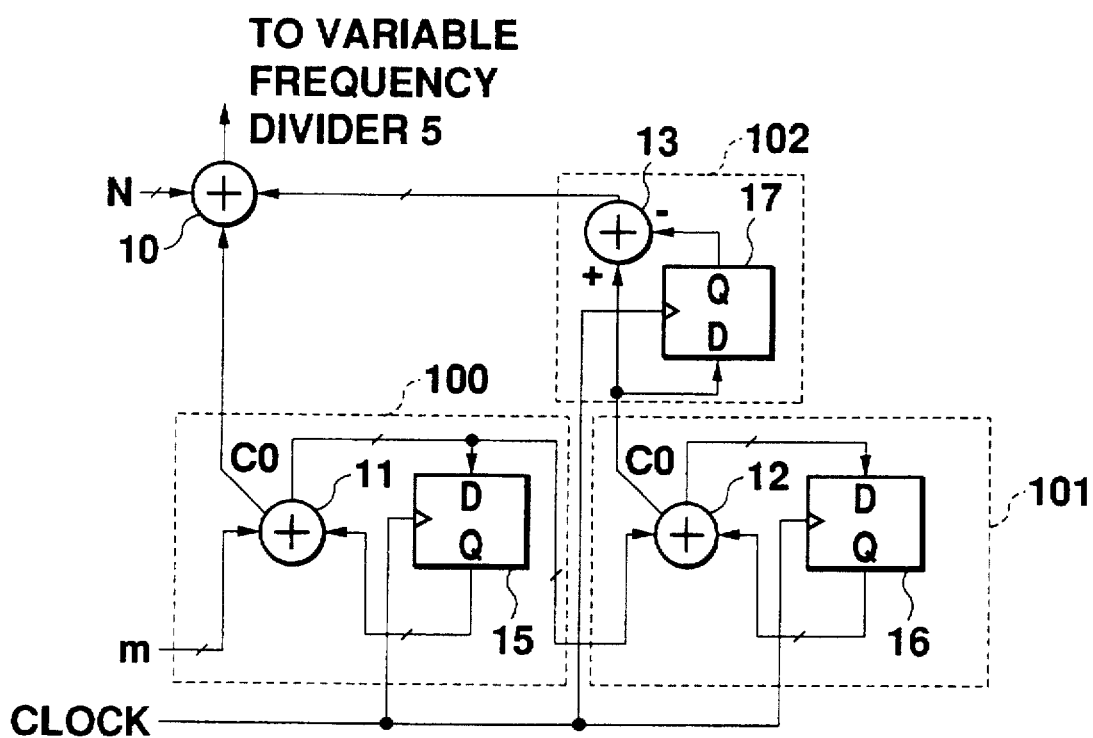
FIG. 15 is a circuit diagram showing another example of a conventional frequency dividing ratio generating means.

As shown in FIG. 2, frequency dividing ratio generating means 8 of this embodiment comprises an integrator 100 consisting of an adder 11 and a latch 15, an integrator 101 consisting of an adder 12 and a latch 16, a differentiator 102 consisting of an adder 13 and a latch 17, a differentiator 103 consisting of an adder 14 and a latch 18, and an adder 10 which adds the outputs of integrator 100 and differentiator 102 with a frequency dividing ratio N and outputs the result to variable frequency divider 7. The differences with the conventional example shown in FIG. 12 are the new addition of differentiator 103 consisting of adder 14 and latch 18, and the connections of the output of adder 12 to the inputs of adder 14 and latch 18 of differentiator 103.

The operation of above-mentioned frequency dividing ratio generating means 8 is described hereinafter.

The operations of integrator 100, integrator 101, differentiator 102, and adder 10 are the same as in the above-mentioned conventional example, and the output frequency dividing ratio is also the same. Further, phase comparator 3 to be used in this embodiment connects to a current output type charge pump 4, and the current value of its current supply is $I_D$ (A). From FIG. 16, phase error $\theta_E$, which is output from frequency dividing ratio generating means 8, is $$\theta_E = 2\pi(1-Z^{-1})Q_2 \qquad (7)$$

Figure 16:
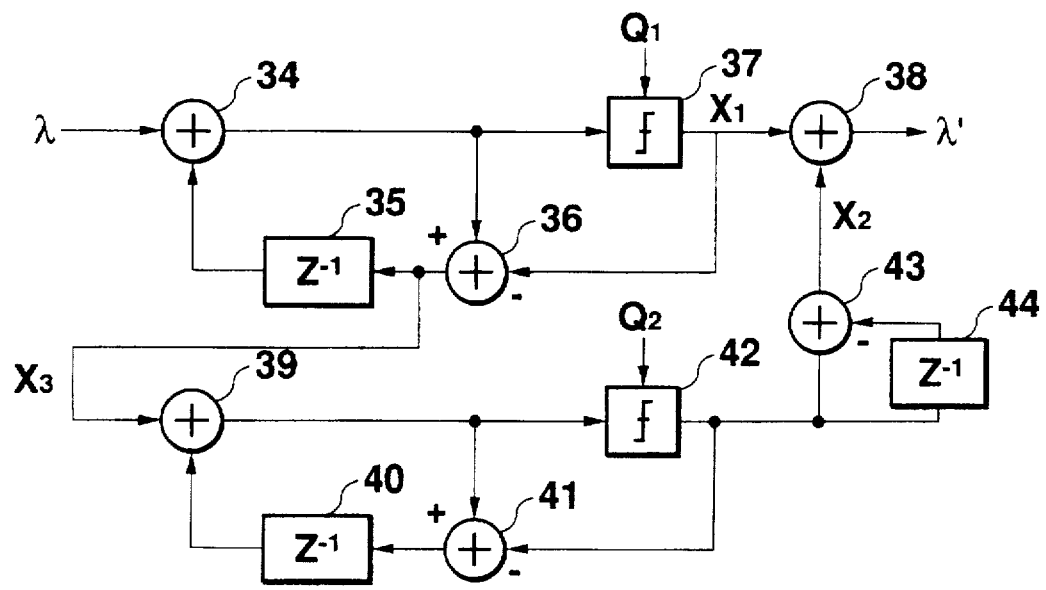
FIG. 16 shows a z transform of the frequency dividing ratio generating means shown in FIG. 15.
Figure 17:
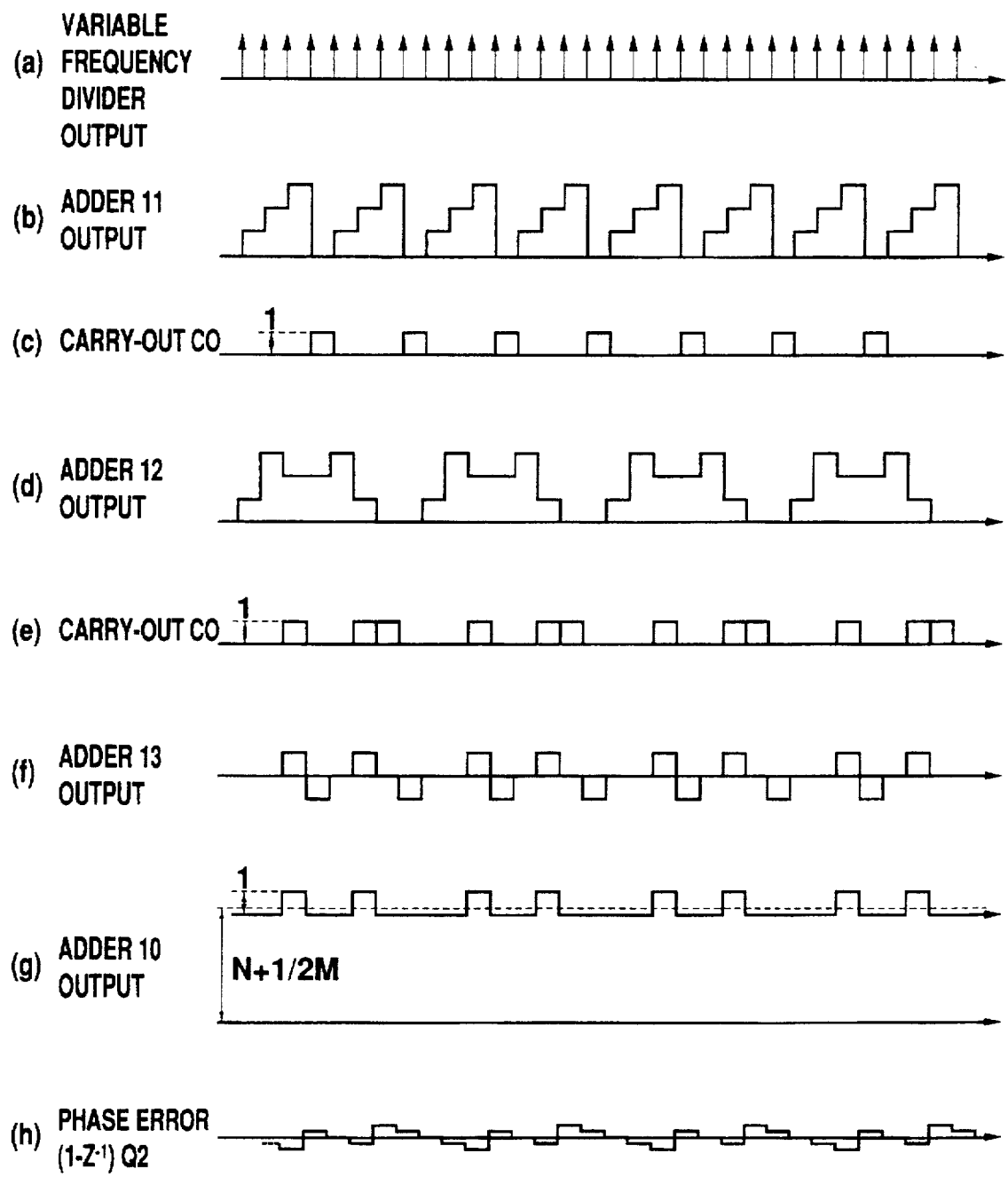
FIG. 17 is a waveform diagram showing an operation of the frequency dividing ratio generating means shown in FIG. 15.
Figure 18:
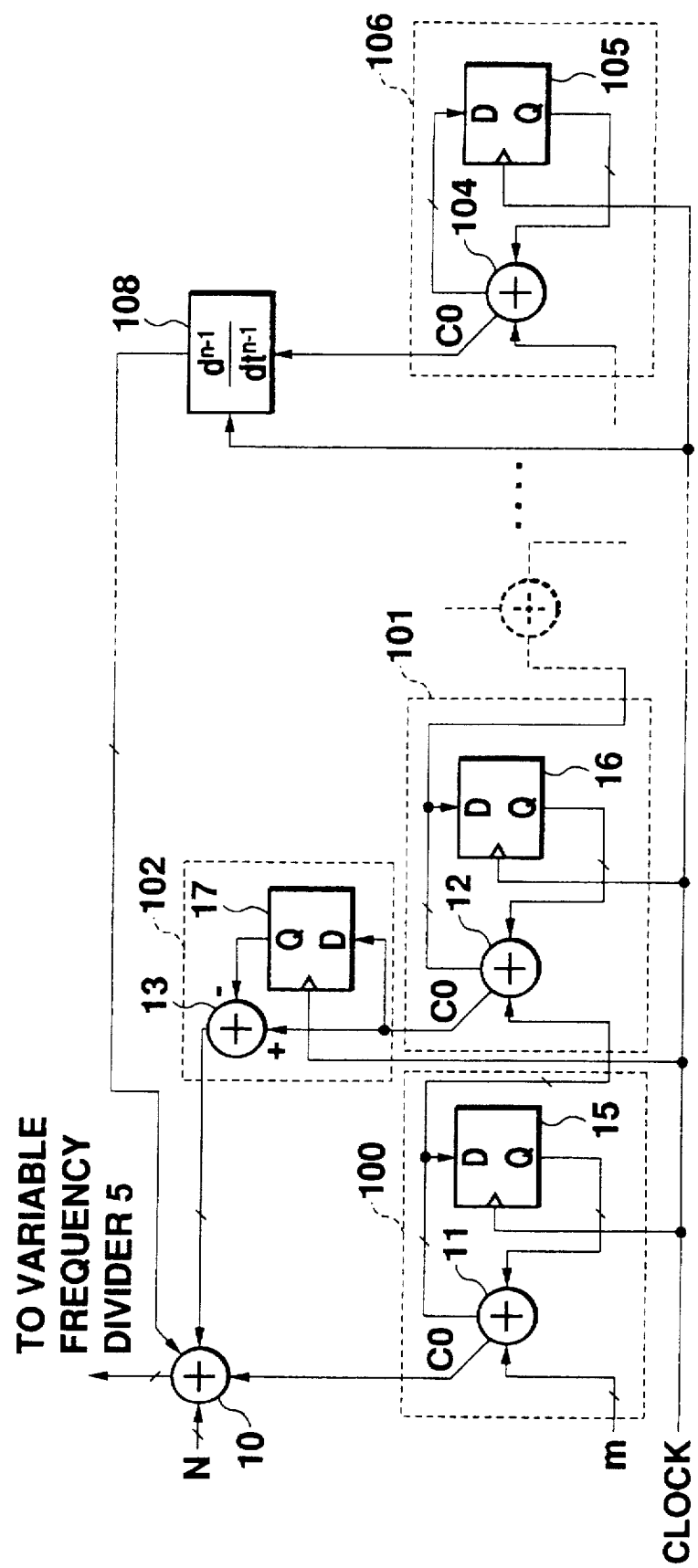
FIG. 18 is a circuit diagram showing another example of a conventional frequency dividing ratio generating means.

As can be seen from the figure showing the z transform shown in FIG. 16, $Q_2$ is the inverted polarity of the output of adder 12 included in integrator 101, and multiplied by $2^M$. In this embodiment, since the output of adder 12, after being differentiated by differentiator 103, is to be used as phase error compensation value $E_\theta$, the output of adder 12 is input to differentiator 103, and the output of differentiator 103 is input to phase error compensating means 9, to perform compensation for the phase error. If the actual phase error is $\theta_E$, the value of phase error compensation value $E_\theta$ becomes $$E_\theta = \frac{2^M}{2\pi} \theta_E \qquad (8)$$

An example of a composition of a phase error compensating means 9 is hereinafter described based on FIG. 3.

Figure 3:
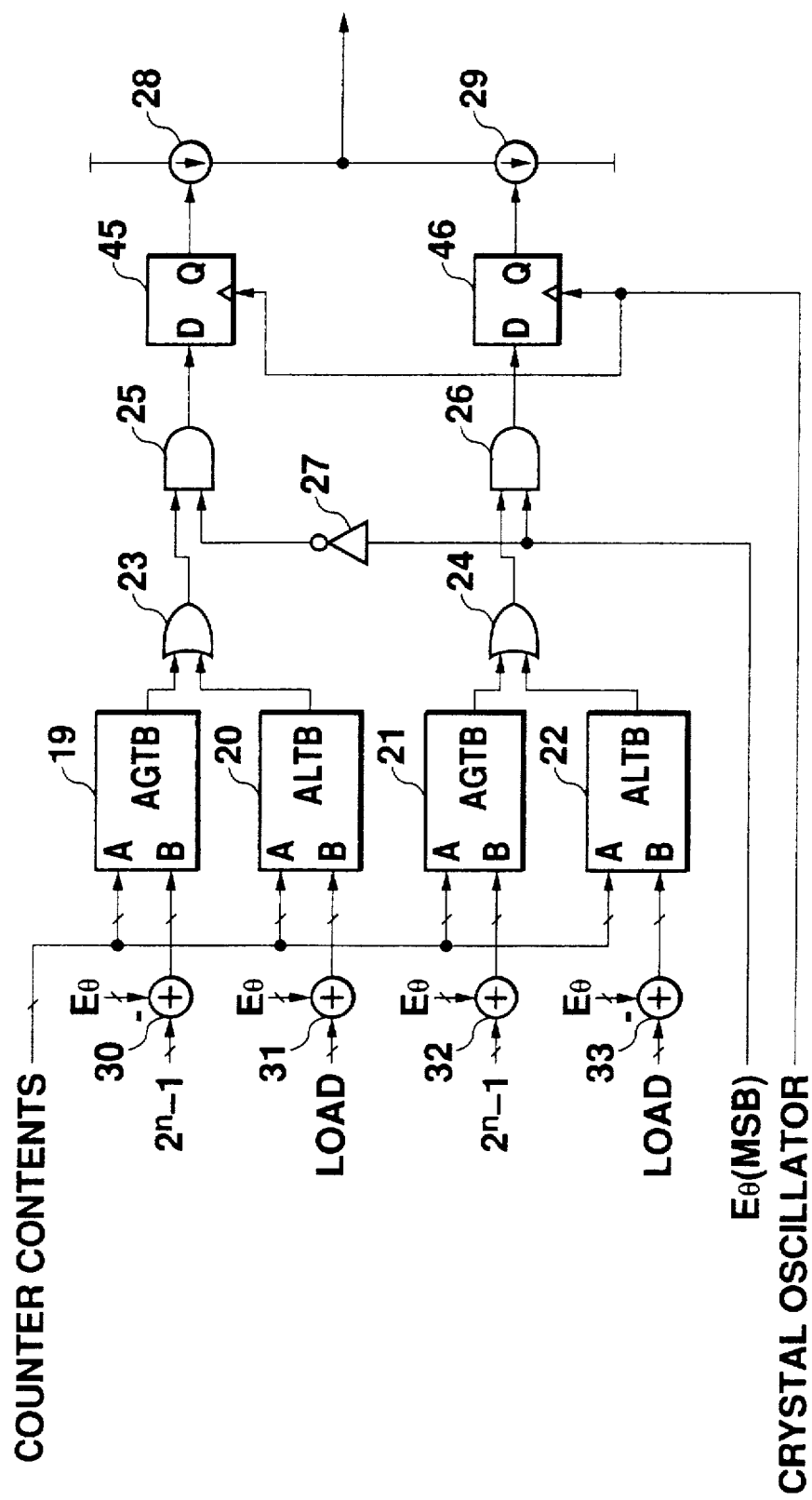
FIG. 3 is a circuit diagram showing an embodiment of a phase error compensating means to be used in the embodiment shown in FIG. 1.

A compositional example of phase error compensating means 9 in this embodiment is shown in FIG. 3. Phase error compensating means 9 comprises a comparator 19, a comparator 20, a comparator 21, a comparator 22, an OR circuit 23, an OR circuit 24, an AND gate 25, an AND gate 26, a current supply 28, a current supply 29, an inverter 27, an adder 30, an adder 31, an adder 32, an adder 33, a flip-flop 45, and a flip-flop 46. Phase comparator 3 in this embodiment performs phase comparison at a trailing edge, and charge pump 4 is of a current output type. Further, current supply 28 and current supply 29 can switch between an operating state and a non-operating state according to control signals provided from AND gate 25 and AND gate 26. If $f_{out}$ is the frequency of the output signal of VCO 6 and frequency $f_{TCXO}$ is the frequency of the output signal of crystal oscillator 1 which is input to fixed frequency divider 2, a current value Ic of current supply 28 and current supply 29 is determined from formula (9).

$$\frac{I_D}{f_{out}2^M} = \frac{2I_C}{F_{TCXO}} \qquad (9)$$

Among the signals which are input to this phase compensating means 9, LOAD is a value which again performs loading after the up counter in fixed frequency divider 2 outputs the ripple carry as a frequency divider output. The counter contents represent a value counted by the up counter in fixed frequency divider 2, and comparisons are performed on a terminal B with the value at a terminal A of comparator 19, comparator 20, comparator 21, and comparator 22. Comparator 19 and comparator 21 output a high level signal if the counted value at terminal A is larger than the value at terminal B, and comparator 20 and comparator 22 output a high level signal if the counted value at terminal A is smaller than the value at terminal B. Values created from adder 30, adder 31, adder 32, and adder 33 are input at terminals B, where a value $2_n-1-E_\theta$ which is output from adder 30, a value LOAD+$E_\theta$ which is output from adder 31, a value $2n-1-E_\theta$ which is output from adder 32, and a value LOAD-$E_\theta$ which is output from adder 33, are fed to terminals B of comparator 19, comparator 20, comparator 21, and comparator 22, respectively. The value $E_\theta$ given here is a compensation value for the phase error in a two's complement representation. Further, $E_\theta$ (MSB) represents the most significant bit of $E_\theta$.

Figure 4:
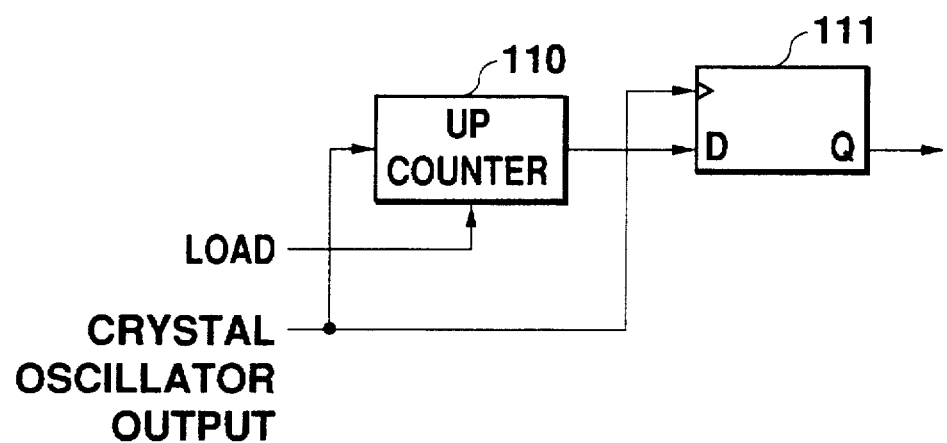
FIG. 4 shows a fixed frequency divider in the embodiment shown in FIG. 1.

FIG. 4 shows a compositional example of fixed frequency divider 2 in this embodiment. A block 110, a traditional n-bit up counter, is composed so that the LOAD value, which is set in advance each time the ripple carry is output, is read and the up counter restarts. The frequency dividing ratio of fixed frequency divider 2, which is outputting the ripple carry, is $2^n$-LOAD. A block 111 is a flip-flop which re-times and delays by one period the ripple carry of the up counter to synchronize the phase with the compensation signal.

Figure 5:
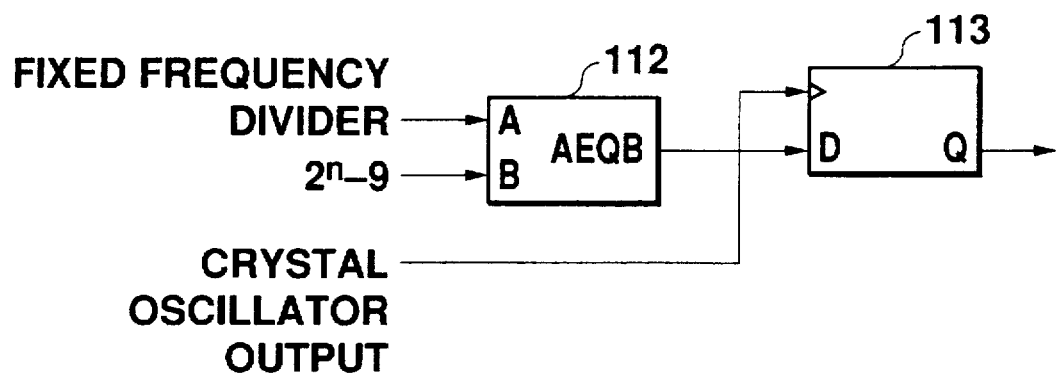
FIG. 5 shows a clock generating means in the embodiment shown in FIG. 1.

FIG. 5 shows a compositional example of clock generating means 109 which generates the clock for frequency dividing ratio generating means 8 in this embodiment. A block 112 is a comparator which compares a preset value $2_n-9$ with the value counted by up counter 110, which is included in fixed frequency divider 2, and outputs a high level signal only when they are equal, and a block 113 is a flip-flop which re-times the output of comparator 112 while using the output of the crystal oscillator as a clock.

Figure 6:
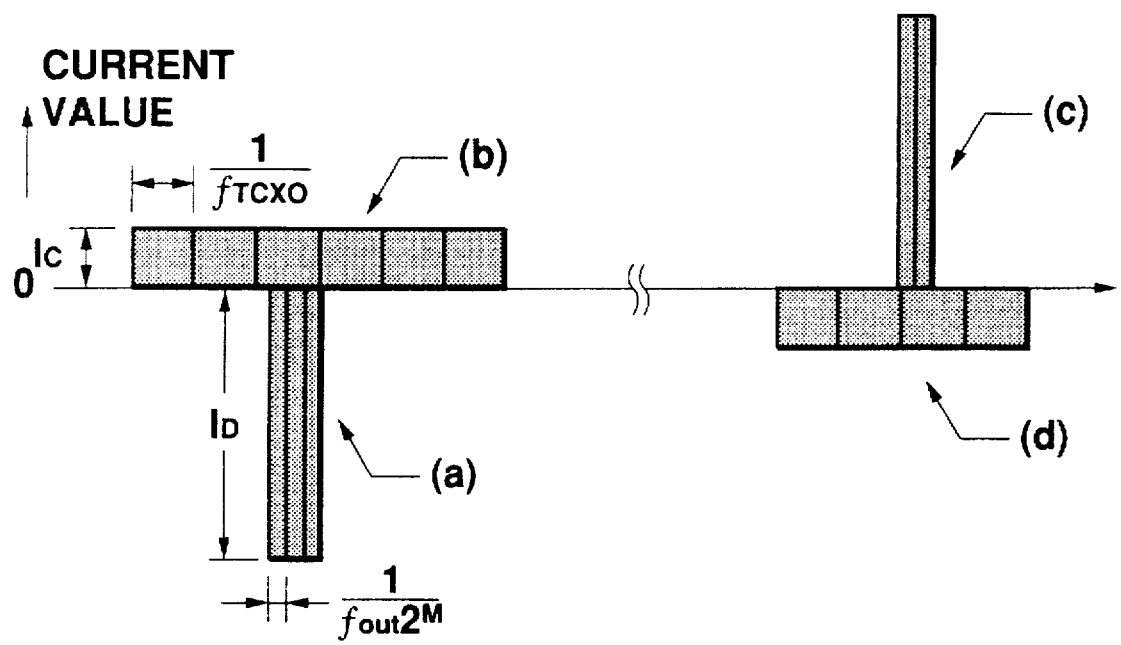
FIG. 6 shows a waveform of a phase error that is output to the phase comparator of the embodiment shown in FIG. 1, and an output waveform of the phase error compensating means.

An operation of this embodiment is described hereinafter with reference to FIG. 6 and FIG. 7. In FIG. 6, (a) and (c) respectively show the waveforms caused by phase error which are output by charge pump 4 when $E_\theta=3$ and $E_\theta=-2$, and (b) and (d) respectively show the waveforms of the phase error compensation signals which are output by phase error compensating means 9 to compensate these waveforms.

Figure 7:
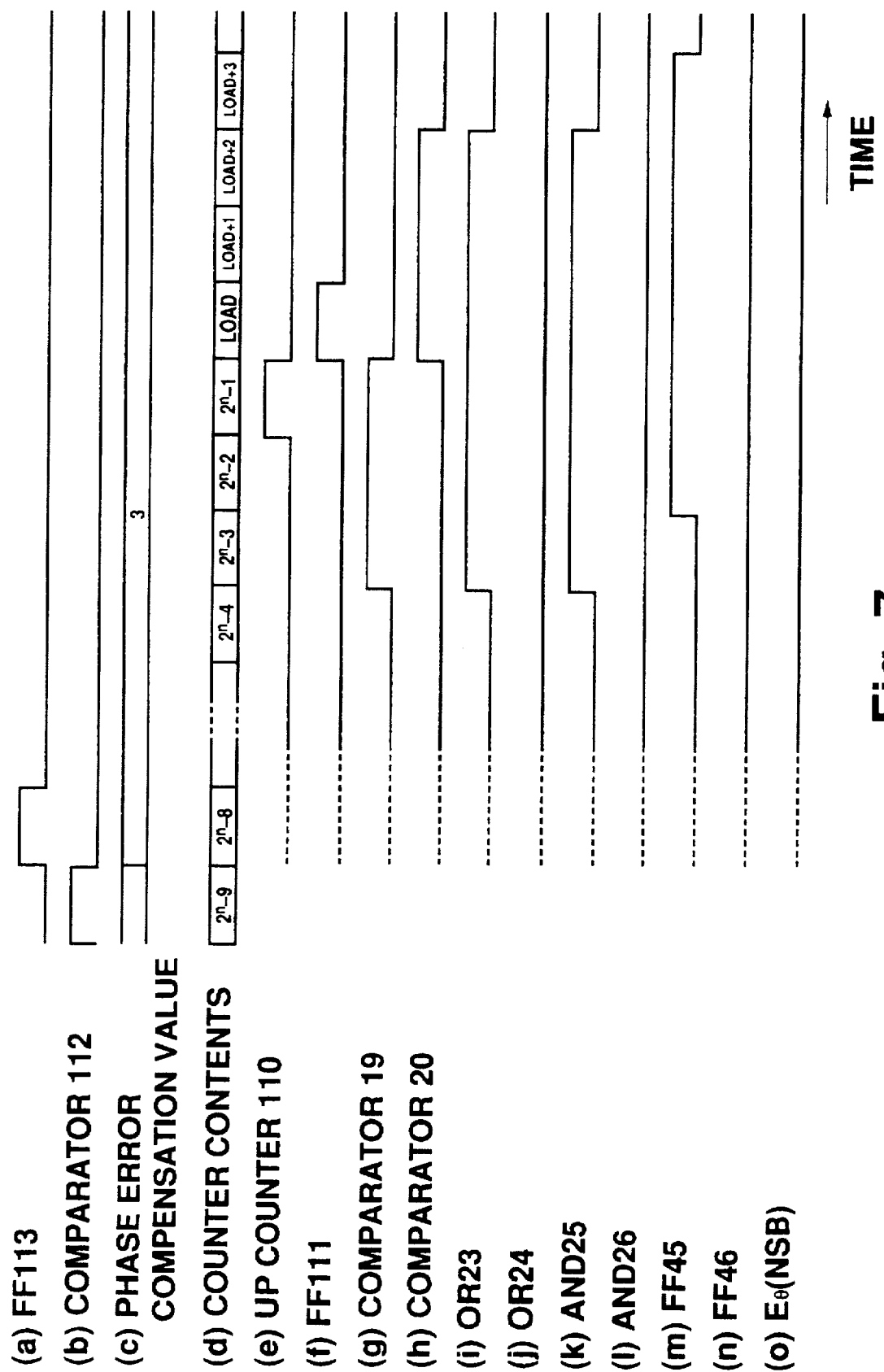
FIG. 7 is a waveform diagram showing an operation to the phase error compensating means shown in FIG. 3.

FIG. 7 is a waveform diagram showing operations of various parts. As a typical example, a case where $E_\theta=3$ is described here. In FIG. 7, the alphabetic characters designate respectively: (a), output of flip-flop 113 included in clock generating means 109; (b), output of comparator 112 included in clock generating means 109; (c), phase error compensation value provided to phase error compensating means 9; (d), contents of the up counter included in fixed frequency divider 2; (e), ripple carry of the up counter included in fixed frequency divider 2; (f), output of flip-flop 111 included in fixed frequency divider 2; (g), output of comparator 19 included in phase error compensating means 9; (h), output of comparator 20 included in phase error compensating means 9; (i), output of OR circuit 23 included in phase error compensating means 9; (j), output of OR circuit 24 included in phase error compensating means 9; (k), output of AND gate 25 included in phase error compensating means 9; (1), output of AND gate 26 included in phase error compensating means 9; (m), output of flip-flop 45 included in phase error compensating means 9; (n), output of flip-flop 46 included in phase error compensating means 9; (o), MSB of $E_\theta$.

An explanation is given here with the contents of up counter 110. When the counter contents of up counter 110 reach $2^n-9$, comparator 112 outputs a high level signal. When the contents of up counter 110 are $2^n-8$, flip-flop 113 performs re-timing of the comparator output and outputs a high level signal which is used as a clock at frequency dividing ratio generating means 8 where integration is performed, and a new phase error compensation value $E_\theta=3$ is output. When the counter contents of up counter 110 become $2^n-3$, comparator 19 outputs a high level signal and the output of OR circuit 23 goes high level. Since $E_\theta$ is a two's complement representation and the MSB of $E_\theta$ is low when $E_\theta=3$, AND gate 25 passes along the output of OR circuit 23. When the counter contents of up counter 110 are $2^n-2$, flip-flop 45 re-times and outputs the output of AND gate 25 to current supply 28 to control the operating state. When the counter contents of up counter 110 become $2^n-1$, up counter 110 outputs a ripple carry and performs reading of LOAD. When the counter contents of up counter 110 are LOAD, flip-flop 111 re-times and outputs the ripple carry-out of up counter 110 for use as the output signal of fixed frequency divider 2. When the counter contents of up counter 110 become LOAD, the output of comparator 19 goes low level. However, the output of comparator 20 goes high level so that the output of OR circuit 23 remains high level. When the counter contents become LOAD+3, comparator 20 outputs a low level signal, the output of the OR gate goes low level, and the output of the AND gate goes low level. When the counter contents of up counter 110 are LOAD+4, the output of AND gate 25 is re-timed by flip-flop 45 to control current supply 28 to the non-operating state. Through these operations, the pulse width becomes equal to 6 periods of crystal oscillator 1, and the value of the time integral of the current supplied by current supply 28 is expressed as follows:

$$\frac{2I_C}{f_{TCXO}} \cdot 3 = \frac{I_D}{f_{out}2^M} \cdot 3 \qquad (10)$$

where the phase error $\theta_E$ of $f_{out}$ generated from variable frequency divider 7 at this time becomes $$\theta_E = -\frac{3}{2^M} \cdot 2\pi \qquad (11)$$

The waveform generated in phase comparator 3 from phase error $\theta_E$ is the waveform of (a) in FIG. 4 and the integration value of the current of this waveform is expressed in formula (12) below.

$$-\frac{3}{2^M} \cdot \frac{I_D}{f_{out}} \qquad (12)$$

This value becomes equal to the integration value of the current output from phase error compensating means 9 expressed in formula (10). Furthermore, since the pulse generated from phase error is generated near the trailing edge of the output of fixed frequency divider 2, the phase error compensation signal and the phase of the pulse generated from phase error can be synchronized by re-timing the output of up counter 110 at flip-flop 111. In this manner, phase error compensating means 9 perform compensation on the current generated from phase comparator 3 due to phase error $\theta_E$.

Second Embodiment

Figure 8:
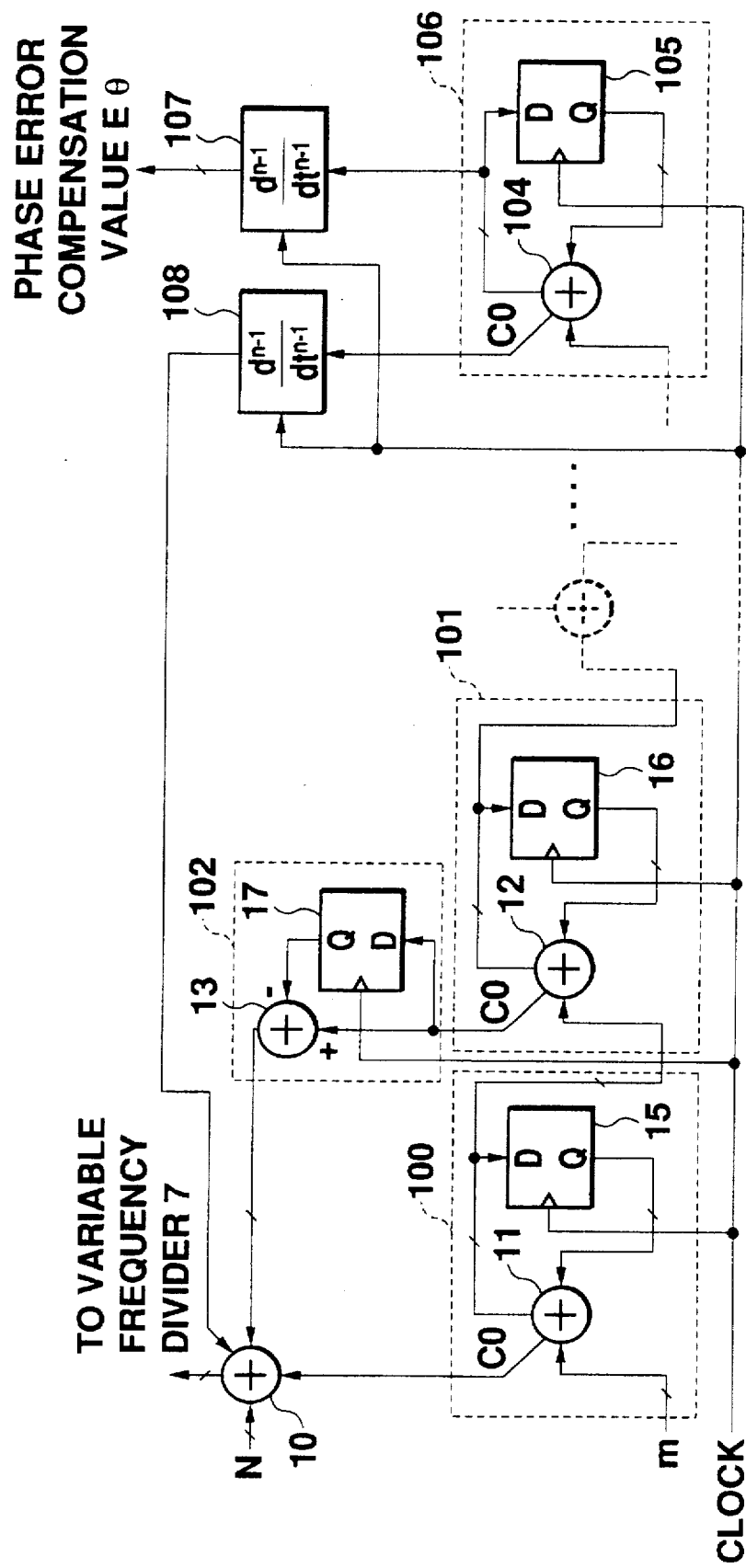
FIG. 8 is a circuit diagram showing a second embodiment of a frequency dividing ratio generating means to be used in this invention.

The integrators were connected in two cascaded stages in the above-mentioned embodiment. FIG. 8 shows an embodiment where the integrators connected in cascade are further increased in number so that the number of stages is n. In this case, the decimal part $\lambda'$ of the frequency dividing ratio becomes $$\lambda' = \lambda + (1-Z^{-1})^n Q_n \qquad (13)$$

and the phase error $\theta_E$ becomes $$\theta_E = 2\pi(1-Z^{-1})^{n-1} Q_n \qquad (14)$$

$Q_n$ is the output of an adder 104 included in an integrator 106 of the nth stage which is the final stage, and this output is differentiated to the (n−1)th order at a differentiator 107, then input by phase error compensating means 9 to perform compensation for the phase error.

In accordance with this embodiment, superior spurious suppression can be achieved since the outputs of multiple integrator stages are differentiated to obtain the phase error compensation value.

Third Embodiment

Figure 9:
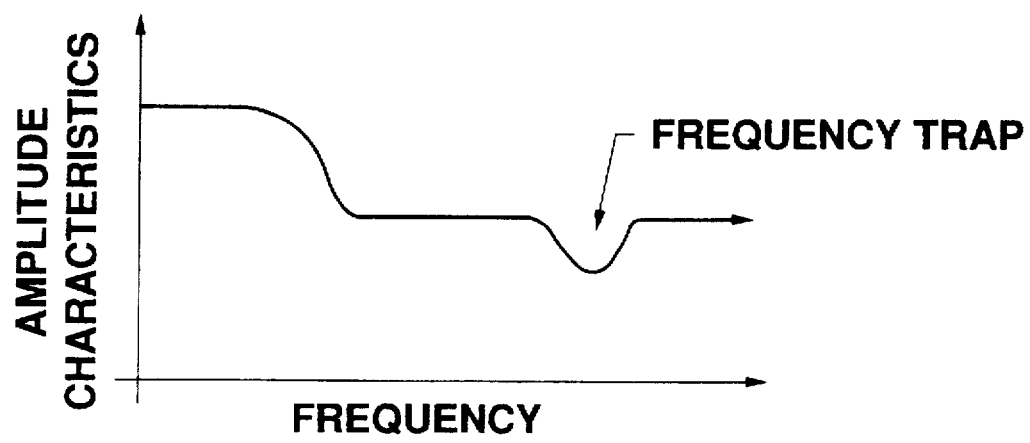
FIG. 9 shows frequency characteristics of a loop filter of a third embodiment to be used in this invention.

If the suppression of spurious emissions is still insufficient, even though compensation is performed in this manner, the use of a filter having amplitude-frequency characteristics shown in FIG. 9 for loop filter 5 is effective. This filter comprises a lag-lead filter and a frequency trap having extremely shallow characteristics, and can perform sufficient suppression of spurious emissions if the frequency trap is set to a frequency equal to the especially problematic detuning frequency when spurious emissions are generated in the frequency synthesizer output signal.

Fourth Embodiment

This embodiment is composed so that current supply 28 and current supply 29, included in phase error compensating means 9, output a current of $I_B+I_C$ when the control signal is high level and a current of $I_B$ when the control signal is low level.

Figure 10:
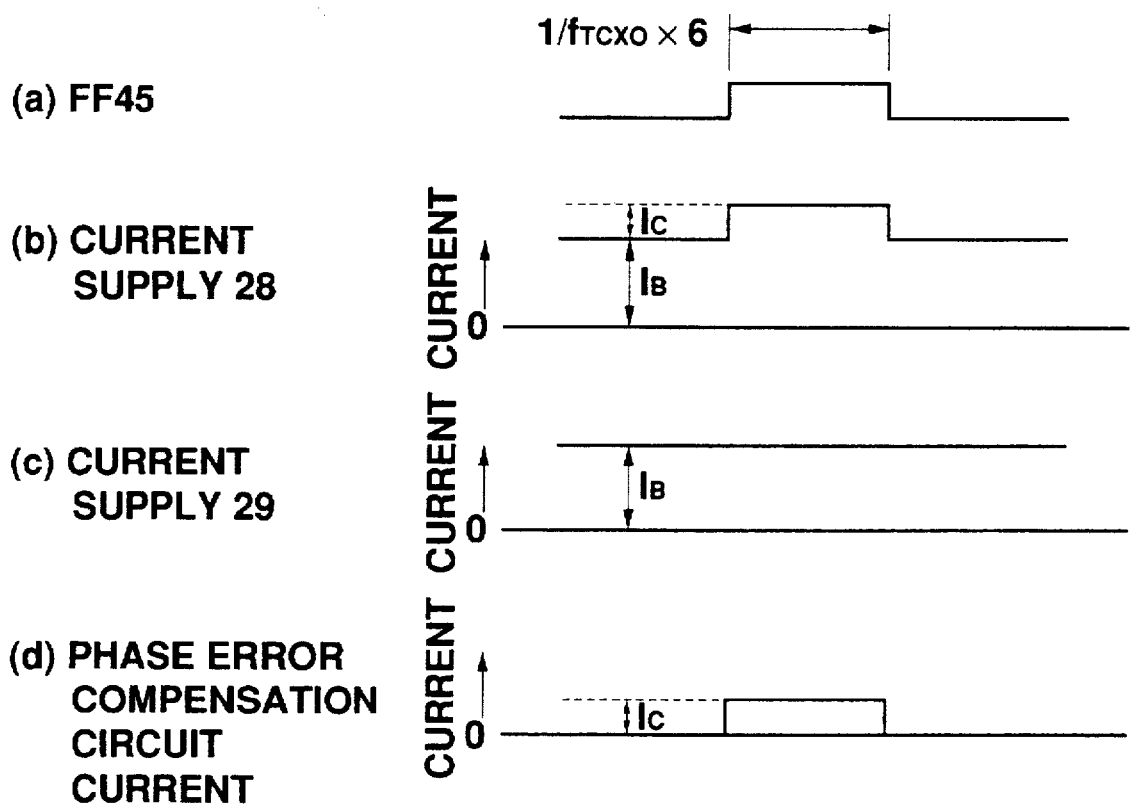
FIG. 10 shows an operation of a fourth embodiment of this invention.

FIG. 10 explains an operation of this embodiment when E=3 is input to phase error compensating means 9. In this figure, (a) is an output of flip-flop 45 which becomes a control signal, (b) is a timing waveform of current supply 28, (c) is a timing waveform of the output of current supply 29, and (d) is a timing waveform of the output of phase error compensating means 9.

As can be seen from FIG. 10, since the current output of phase error compensating means 9 is the result of subtracting the output of current supply 29 from the output of current supply 28, the current value of the signal (d) which is output by phase error compensating means 9 is the equivalent to that in the first embodiment, and compensation for the current generated from charge pump 4 due to phase error $\theta_E$ can be performed.

In accordance with the frequency synthesizer of this invention, the spurious performance can be improved considerably and frequency switching can be performed at high speeds without using, as in conventional methods an extremely high phase comparison frequency and even when using a relatively low phase comparison frequency. Furthermore, an inexpensive, low power consumption, high-speed switching frequency synthesizer can be realized since phase error compensation can be performed without using complex analog circuitry such as D/A converters.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A frequency synthesizer comprising
   a crystal oscillator,
   a fixed frequency divider for dividing the output of the crystal oscillator to output a reference frequency,
   a voltage-controlled oscillator,
   a variable frequency divider for dividing the output of the voltage-controlled oscillator at a frequency dividing ratio,
   a phase comparator for detecting and outputting the phase difference of the reference frequency and the output of the variable frequency divider,
   a loop filter for smoothing the phase difference signal, which is output from the phase comparator, as a signal output to control said voltage-controlled oscillator, and
   a frequency dividing ratio generating means for providing an integral frequency dividing ratio to and controlling said variable frequency divider,
   wherein said frequency dividing ratio generating means comprises n stages (n=1,2,3, . . . ) of integrators connected in cascade and n−1 differentiators for differentiating carry-out signals of the integrators, and composed so that a phase error generated at said variable frequency divider is obtained from an output of an adder included in an integrator in a final stage of the frequency dividing ratio generating means and a phase error compensation value is output,
   and further comprising a phase error compensating means for performing phase error compensation by varying the pulse width of a signal to be used for compensating for phase error based on the phase error compensation value which is output from said frequency dividing ratio generating means.

2. The frequency synthesizer according to claim 1 wherein said frequency dividing ratio generating means in said frequency synthesizer comprises integrators, differentiators, and one adder whereby the integrators are connected in cascade to n stages and the carry-out signal of the ith stage integrator is differentiated to the (i−1)th order, the differentiator outputs are all input by the adder and a sum is taken with the integral part of the frequency dividing ratio, the sum is input by the variable frequency divider as a frequency dividing ratio, and by further differentiating to the (n−1)th order the integration result of the integrator of the nth stage, the phase error compensation value is extracted and input by the phase error compensating means.

3. The frequency synthesizer according to claim 1 wherein said phase error compensating means of said frequency synthesizer feature a varying of the pulse width of the signal to be used for compensating for phase error to compensate for the phase error by switching between operation and non-operation of a current supply or a voltage supply in accordance with a value counted by the fixed frequency divider.

4. The frequency synthesizer according to claim 3 wherein said phase error compensating means comprises
   an adder for adding the phase error compensation value, extracted from the frequency dividing ratio generation circuit, with a preset value and for outputting the result,
   a subtracter for subtracting the phase error compensation value, extracted from the frequency dividing ratio generation circuit, from a preset value and for outputting the result, and
   a plurality of comparators for performing comparisons on outputs of said adder and subtracter, and on the value counted by the fixed frequency divider,
   whereby the pulse width of the signal to be used for compensating for phase error is varied by passing outputs of said comparators through gates and flip-flops and outputting a control signal for switching between operation or non-operation of the current supply or the voltage supply.

5. The frequency synthesizer according to claim 1 wherein said frequency synthesizer features current outputs from the phase comparator and the phase error compensating means, and a direct connection between the phase comparator and the phase error compensating means.

6. The frequency synthesizer according to claim 1 wherein the loop filter includes a frequency trap matching a predetermined frequency.

7. The frequency synthesizer according to claim 1 wherein the output of the fixed frequency divider is delayed by one period of the signal output by the crystal oscillator.

8. The frequency synthesizer according to claim 1 comprising a comparator for comparing the value counted by said fixed frequency divider with a preset value, and for outputting the result of the comparison to a flip-flop, said flip-flop using the output of the crystal oscillator as a clock, and featuring the use of an output of the flip-flop as a clock for the integrators and the differentiators.

9. The frequency synthesizer according to claim 3 wherein said phase error compensating means comprises
   an adder for adding the phase error compensation value extracted from thefrequency dividing ratio generation circuit with a preset value and for outputting the result,
   a subtracter for subtracting the phase error compensation value extracted from the frequency dividing ratio generation circuit from a preset value and for outputting the result, and
   a plurality of comparators for performing comparisons on outputs of said adder and subtracter, and on the value counted by the fixed frequency divider,
   whereby the pulse width of the signal to be used for compensating for phase error is varied by passing outputs of said comparators through gates and flip-flops and outputting a control signal for switching the amount of current output from the current supply.

* * * * *